United States Patent
Christenson (10) Patent No.: US 7,476,616 B2
(45) Date of Patent: Jan. 13, 2009

(54) REAGENT ACTIVATOR FOR ELECTROLESS PLATING

(75) Inventor: Kurt Karl Christenson, Minnetonka, MN (US)

(73) Assignee: FSI International, Inc., Chaska, MN (US)

( * ) Notice: Subject to any disclaimer, the term of this patent is extended or adjusted under 35 U.S.C. 154(b) by 484 days.

(21) Appl. No.: 11/300,153

(22) Filed: Dec. 13, 2005

(65) Prior Publication Data
US 2006/0128133 A1 Jun. 15, 2006

Related U.S. Application Data

(60) Provisional application No. 60/635,779, filed on Dec. 13, 2004.

(51) Int. Cl.
*H01L 21/44* (2006.01)

(52) U.S. Cl. .................. 438/678; 427/443.1; 427/437

(58) Field of Classification Search .............. 438/678; 427/443.1, 437
See application file for complete search history.

(56) References Cited

U.S. PATENT DOCUMENTS

| | | |
|---|---|---|
| 5,169,680 A | 12/1992 | Ting et al. |
| 5,695,810 A | 12/1997 | Dubin et al. |
| 5,824,599 A | 10/1998 | Schacham-Diamand et al. |
| 5,971,368 A | 10/1999 | Nelson et al. |
| 6,235,641 B1 | 5/2001 | Christenson |
| 6,274,506 B1 | 8/2001 | Christenson et al. |
| 6,406,750 B1 * | 6/2002 | Izaki et al. ................ 427/98.1 |
| 6,461,678 B1 * | 10/2002 | Chen et al. ................ 427/304 |
| 6,648,307 B2 | 11/2003 | Nelson et al. |
| 6,696,758 B2 | 2/2004 | Dubin et al. |
| 7,087,104 B2 * | 8/2006 | Choi et al. ................. 106/1.22 |
| 2003/0113576 A1 | 6/2003 | Chebiam et al. |
| 2004/0026786 A1 | 2/2004 | Leu et al. |
| 2005/0153078 A1 * | 7/2005 | Bentley et al. ........... 427/443.1 |
| 2005/0200123 A1 | 9/2005 | Benson et al. |
| 2006/0045974 A1 * | 3/2006 | Campbell et al. ........... 427/304 |
| 2006/0134318 A1 * | 6/2006 | Hudd et al. ................ 427/98.4 |

OTHER PUBLICATIONS

O'Sullivan, et al, "Electrolessly deposited diffusion barriers for microelectronics," IBM J. Res. Develop. vol. 42, No. 5, Sep. 1998, p. 607.

Watanabe, et al, "Direct Electroless Nickel Plating on Copper Circuits Using DMAB as a Second Reducing Agent," J. Jap. Inst. for Interconnecting and Packaging Electronic Circuit, 12 (4), (1997), pp. 149-153.

(Continued)

*Primary Examiner*—Trung Dang
(74) *Attorney, Agent, or Firm*—Kagan Binder, PLLC (57) ABSTRACT

A method for electroless plating of a substrate is provided that comprises exposing an electroless plating reagent comprising a metal to be plated and at least one reducing agent to a solid phase Activation Material to form an activated electroless plating reagent prior to application of the electroless plating reagent to the substrate. The activated electroless plating reagent is applied to a substrate in the process chamber under conditions to cause the metal of the electroless plating reagent to deposit on the substrate. Systems and modules are also described.

16 Claims, 10 Drawing Sheets
(10 of 10 Drawing Sheet(s) Filed in Color)

OTHER PUBLICATIONS

O'Mallory, et al, "The Fundamental Aspects of Electroless Nickel Plating," pp. 1-56 and "The Electroless Nickel Plating Bath: Effect of Variables on the Process," pp. 57-99, American Electroplaters and Surface Finishers Society (2000).

Bindra, et al, "Fundamental Aspects of Electroless Copper Plating," pp. 289-332, and Frank E. Stone, "Electroless Copper In Printed Wiring Board Fabrication," pp. 333-375, American Electroplaters and Surface Finishers Society (2000).

W.H.Safranek, "Electroless Cobalt and Cobalt Alloys," American Electroplaters and Surface Finishers Society, pp. 463-538 (2000).

Mital, et al, "Studies of Electroless Nickel Deposition Using Electroanalytical Techniques," Metal Finishing, vol. 85, No. 6, pp. 87-90, (1987).

* cited by examiner

REAGENT ACTIVATOR FOR ELECTROLESS PLATING

This application claims the benefit of U.S. Provisional Application Ser. No. 60/635,779, filed Dec. 13, 2004, entitled "REAGENT ACTIVATOR FOR ELECTROLESS PLATING" which application is incorporated herein by reference in its entirety.

BACKGROUND OF THE INVENTION

Thin metal layers are useful in many industrial applications. For example, the advanced copper interconnect technology used in semiconductors requires the use of thin metal layers to act as diffusion barriers to prevent Cu diffusion into the insulating dielectric or to reduce electromigration at the surface of Cu lines. Electroless plating is a process for plating material onto a surface in the absence of an external electric current. Plating reagents using electrochemical phenomena, e.g. oxidation/reduction reactions, have been used for electroless plating. Specifically, the deposition of a few tens of nanometers of a Co or Ni alloy additionally comprising a few percent of an additional component (typically W, P, B or Mo) by an electroless process has been considered. For example, the alloy Co(P) has been identified as useful by E. J. O'Sullivan et al., "Electrolessly Deposited Diffusion Barriers for Microelectronics," IBM J. Res. Dev., 42 (5) September 1998, p. 607.

The details of the plating mechanisms in electroless plating processes seem to be poorly understood, and are the subject of many papers in the academic and trade literature. For a review of electroless plating, see Mallory and Hajdu, "Electroless Plating: Fundamentals and Applications," American Electroplaters and Surface Finishers Society, Orlando. The use of two or more reducing agents is sometimes necessary, one to initiate plating on the substrate material, and one to continue plating onto the partially plated layer. The reducing agent(s) can also be used to supply desired additional components. The use of two reducing agents that are hypophosphite and a dimethylamine borane complex is discussed in Mital et al., "Studies of Elecectroless Nickel Deposition Using Electroanalytical Techniques," Metal Finishing Mag., June 1987, p. 87. The use of hypophosphite and a dimethylamine borane complex reducing agents to plate nickel onto copper is discussed in Watanabe et al., "Electroless Nickel Plating Using DMAB as $2^{nd}$ Reducing Agent," J. Jap. Inst. For Interconnecting and Packaging Electronic Circuit, 12 (4) 1997, p. 231. Electroless plating is also discussed in US Patent Application Nos. 2003/0113576 and 2004/0026786 and U.S. Pat. Nos. 5,169,680; 5,695,810; 5,824,599; and 6,696,758.

SUMMARY OF THE INVENTION

A method for electroless plating of a substrate in a process chamber is provided that comprises exposing an electroless plating reagent comprising a metal to be plated and at least one reducing agent to a solid phase Activation Material to form an activated electroless plating reagent prior to application of the electroless plating reagent to the substrate. The activated electroless plating reagent is applied to a substrate in the process chamber under conditions to cause the metal of the electroless plating reagent to deposit on the substrate. The thus deposited metal is in the form of a plating or film of material on the substrate, and may be a continuous or discontinuous material.

For purposes of the present invention, an Activation Material is a material that comprises a transition metal in metallic form having a surface to which a liquid reagent can be exposed. The Activation Material can comprise the metal to be plated (i.e. the metal(s) in the electroless plating reagent). Preferably, the Activation Material is provided in a configuration that provides a surface area that efficiently exposes the electroless plating reagent to the Activation Material. The Activation Material can comprise a single metal or an alloy, and can be provided as an amorphous material, crystalline material or an intermetallic material.

For purposes of the present disclosure, this deposited metal will be referred to herein as a "coating." Pre-exposure of the electroless plating reagent to the Activation Material prior to application of the electroless plating reagent to the substrate, and preferably outside of the process chamber provides a number of advantages. It has surprisingly been found that by carrying out this pre-exposure step, the electroless plating reagent can be prepared for immediate efficient plating processes upon the reagent's first introduction to the process chamber. Thus, fresh chemistry can be introduced to the substrate, and in one embodiment to the process chamber, that is immediately effective for plating operations. Additionally, in substrate treatment operations designed for recycling operations, there are no dead cycles in the treatment process, and there is no need to utilize "dummy product" or sacrificial first run material that will not provide a commercially acceptable product. Additionally, the activity of the electroless plating reagent in the method of the present invention can be established and normalized prior to introduction to the process chamber. This is a distinct advantage over providing Activation Material in the process chamber, thereby avoiding potentially uncontrolled chemical activation in the process chamber and/or localized differences in reagent activity due to positioning of the Activation Material in the process chamber.

The exposure of the electroless plating reagent to the Activation Material is preferably carried out as a continuous process, with the electroless plating reagent being caused to flow in a manner that provides contact with an Activation Material. Alternatively, the electroless plating reagent can be exposed to the Activation Material in a non-continuous process, wherein the electroless plating reagent is placed in a tank or bath with the Activation Material and allowed to reside (and optionally circulated therein) in a manner and time sufficient to provide contact with the Activation Material as a batch process.

The method as described herein provides excellent plating uniformity and superior surface quality, preferably manifested in providing a deposition of more uniform thickness than the alternative plating processes. Additionally, the present method provides a high net plating rate. Because the present method is highly efficient, reduced chemical usage and increased throughput of material can be obtained.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

As noted above, the electroless plating reagent comprises a metal to be plated. This metal is provided in ionic form, and preferably is selected from copper (Cu), silver (Ag), gold (Au), nickel (Ni), palladium (Pd), platinum (Pt), cobalt (Co), rhodium (Rh), iridium (Ir), and combinations thereof. Preferably, the metal to be plated is present in the electroless plating reagent at from about 2 gram/liter to about 50 gram/liter, and more preferably from about 5 gram/liter to about 35 gram/liter.

Secondary metals can also be provided in the electroless plating reagent. The secondary metal is also provided in ionic form, and preferably is selected from the group of chromium (Cr), molybdenum (Mo), tungsten (W), manganese (Mn), technetium (Tc), rhenium (Re), and combinations thereof. Preferably, the secondary metal is present in the electroless plating reagent at from about 1 gram/liter to about 40 gram/liter, and more preferably from about 2 gram/liter to about 35 gram/liter. While not being bound by theory, it is believed that the presence of a small amount of secondary metal together with the primary metal to form an alloy coating improves the barrier properties of the resulting plated coating by filling in the grain boundaries of the crystalline structure of the coating. The inclusion of a plurality of additional metals in the electroless plating reagent is also contemplated. The formation of ternary and quaternary alloys in the plating process are specifically contemplated, in addition to alloys containing five or more metals. Examples of preferred alloys include NiMoP, CoWP, CoWPB, and the like.

The electroless plating reagent additionally comprises a reducing agent in order to assist metal deposition. Preferably, the reducing agent comprises boron (B). Preferred reducing agents include ammonium, alkali metal, alkaline earth metal borohydrides, and the like, and combinations thereof. Particularly preferred reducing agents include sodium borohydride, lithium borohydride, zinc borohydride, and the like, and combinations thereof. Other particularly preferred reducing agents include aminoboranes, such as dimethylamine borane complex (DMAB), diethylamine borane, morpholine borane, combinations thereof, and the like. In one embodiment, the reducing agent(s) is present at from about 1 gram/liter to about 30 gram/liter, and more preferably from about 2 gram/liter to about 20 gram/liter.

The electroless plating reagent preferably additionally comprises a second reducing agent. Preferably this second reducing agent is a phosphorus-containing compound. Preferred such phosphorus-containing compounds are the hypophosphites, such as ammonium hypophosphite; the hypophosphites of lithium, sodium, potassium, magnesium, calcium, strontium and mixtures thereof; nickel hypophosphite; hypophosphorous acid and the like. Other examples of second reducing agents include sulfites, bisulfites, hydrosulfites, metabisulfites, dithionates, and tetrathionates, thiosulfates, thioureas, hydrazines, hydroxylamines, aldehydes, glyoxylic acid, reducing sugars, diisobutylaluminum hydride, sodium bis(2-methoxyethoxy)aluminum hydride, and the like. In one embodiment, the second reducing agent(s) is present at from about 0 gram/liter to about 5 gram/liter, and more preferably from about 1 gram/liter to about 2 gram/liter.

In addition to the above components, the electroless plating reagent may comprise pH adjusting/buffering agents, complexing/chelating agents to maintain the metal in solution, wetting agents, and other components appropriate for incorporation in the particular plating process to be conducted. Various electroless plating compositions (and adaptations of the electroless plating process relative to methods of plating of specific devices) as are known in the art may be used, such as is described in Mallory and in US Patent Application Nos 2003/0113576 and 2004/0026786 and US Patent Nos. 5,169,680; 5,695,810; and 6,696,758.

The Activation Material to be used in the present process may comprise the same or a different metal from that which is to be deposited and/or the material of the ultimate substrate. For example, a cobalt-containing electroless plating reagent may be activated by a cobalt Activation Material and deposited onto a copper substrate. In a preferred embodiment, the substrate to be coated comprises a metal, and the Activation Material comprises the same metal as that of the substrate or as the metal being plated. Preferably, the Activation Material comprises a metal selected from copper, silver, gold, nickel, palladium, platinum, cobalt, rhodium, iridium, and combinations thereof. In a preferred embodiment, the electroless plating reagent comprises cobalt, the substrate to be coated comprises copper, and the Activation Material comprises copper, cobalt, or combinations thereof.

The Activation Material is preferably provided in a format having a large surface area, thereby providing highly efficient exposure of the electroless plating reagent to the Activation Material. In one embodiment, the Activation Material is provided in the form of particles or beads. The particles may optionally be spherical, semi-spherical, rod-shaped, helical, in the format of shavings, randomly configured, or in any other desired configuration. Preferably, the particles are provided in sub-millimeter nominal particle size in the largest dimension of the particle. In an alternative configuration, the Activation Material may be provided in the form of a metal wool, a mesh, or an open-celled foam. In any of these configurations, the Activation Material can be solid metal component, non-metal components that are coated with metal, or mixtures of metal and non-metal materials having exposed metal surfaces. Alternative configurations of the Activation Materials having a high surface area will now be apparent to the skilled artisan.

Preferably, the activation of the electroless plating reagent is carried out by flowing the solution through a pathway such as a column or tube that has been packed with media comprising surfaces containing an Activation Material having a high surface area configuration, thereby providing an activation column. The Activation Material may be provided in solid form, or as a coating on a support structure. The Activation Material is preferably provided in excess of the amount required for activation of the electroless plating reagent. In such a configuration, some plating of the dissolved metal from the electroless plating reagent might occur on surfaces of the Activation Material downstream in the activation column. Surprisingly, this plating has been observed to not adversely affect the functionality of the activation column, because that portion of Activation Material upstream from the plated Activation Material continues to activate the electroless plating reagent. Alternately, the plated metal itself can sometimes serve as an activator metal. In this case, the entire Activator can be plated with metal from the plating reagent. For purposes of the present invention, the Activation Material is by definition considered to be outside of the process chamber if the Activation Material is in a pathway feeding reagent to the process chamber, even if the pathway physically extends into or through the walls of the process chamber.

Preferably, the Activation Material is provided in an electroless plating reagent activation module having an electroless plating reagent pathway through which an electroless plating reagent can traverse. An Activation Material is disposed and retained within the module, and a surface in the pathway comprises an Activation Material to which an electroless plating reagent is exposed when traversing the electroless plating reagent pathway. Examples of such modules include tubes or reservoirs that are provided with Activation Material, preferably in a high surface area format. The modules are provided with retention structures, such as screens, packing and similar barriers to prevent loss of Activation Material downstream from the flow of electroless plating reagent through the module. Preferably, a retention structure is provided at both the upstream and downstream ends of the module, so that the module can be readily transported without loss of Activation Material from either end. Additionally, the module can optionally be provided with universal connection at both ends of the module, so that the module may be connected to the plumbing of the system without regard to directionality of the module. Most preferably, the module is provided in a packed column format, much like a chromatography column. In a preferred embodiment, the activation module is provided with transparent walls so that the degree of internal plating and/or exhaustion of Activation Material within the activation module can be visibly inspected.

Preferably, the Activation Material is provided in a configuration that provides a surface area of from about 1 $cm^2/g$ to about 20 $cm^2/g$, more preferably from about 2 $cm^2/g$ to about 15 $cm^2/g$, and most preferably from about 3 $cm^2/g$ to about 10 $cm^2/g$, in order to efficiently expose the electroless plating reagent to the Activation Material. In preferred configurations, a surface area that is lower that the amounts indicated tends to require a large column to provide sufficient contact area of Activation Material to achieve the desired activation of reagent, and a surface area that is lower that the amounts indicated tends to undesirably impede flow of reagent through the Activation Material.

The substrate to be coated or plated may be any substrate where a coating of metal is desired. The thickness of the coating may be any thickness as desired for the substrate to be coated. Preferably the substrate to be coated is an in-process semiconductor device. More preferably, the substrate is a semiconductor wafer. In a particularly preferred embodiment, the substrate semiconductor wafer comprises a patterned copper surface, and metal that is deposited on the wafer comprises cobalt or other suitable diffusion barrier.

The present invention is particularly advantageous for use in applications where the metal is selectively deposited on the substrate. In a preferred embodiment, the substrate is provided with capping layers through selective electroless deposition to control electromigration.

In additional preferred embodiments, the substrate is used to prepare high-density PC boards, or precision platings for medical and aerospace applications.

Preferably, the activated electroless plating reagent has a plating activity such that only non-insulating surfaces of the substrate are plated with the metal of the electroless plating reagent. Thus, surfaces such as metal oxides, plastics, glass and the like are preferably not plated with metal, but metal surfaces such as metallic features are plated by the electroless plating reagent.

Prior to deposition of metal of the electroless plating reagent on the substrate, the surface of the substrate may be prepared by any desired pretreatment technique. For example, the substrate may be pre-cleaned and/or pre-rinsed such as with deionized (DI) water. Additionally, the pretreatment may optionally be a reducing process such that oxidation at the substrate is reversed or an optional seed layer is deposited. Other pretreatment may include organic and inorganic solvents, mineral and organic acids, strong and weak bases, and combinations of any of the above.

The activated electroless plating reagent is applied to a substrate under conditions to cause the metal of the electroless plating reagent to deposit on the substrate in a suitable process chamber. In a preferred embodiment, the electroless plating reagent is sprayed onto the substrate. Alternatively, the electroless plating reagent is immersed in the electroless plating reagent, preferably in a flowing and/or cascading bath.

In a preferred embodiment, the activated electroless plating reagent may be used to treat multiple wafer-like objects simultaneously, as occurs with batches of wafers when being processed in a spray processing tool such as the MERCURY® and ZETA® spray processors available from FSI International, Inc., Chaska, Minn. Examples of wafer treatment equipment are described in U.S. Pat. Nos. 5,971,368; 6,235,641; 6,274,506; and 6,648,307, as well as in Assignee's co-pending U.S. Patent Application titled ROTARY UNIONS, FLUID DELIVERY SYSTEMS, AND RELATED METHODS in the names of Benson et al., filed Mar. 12, 2004, and having U.S. Ser. No. 10/799,250. Other examples of spray processor systems include the SCEPTER™ and SPECTRUM® batch spray processor systems available from Semitool, Inc., Kalispell, Mont.; a single-wafer spray processor system available from SEZ AG, Villach, Austria and sold under the trade designation SEZ 323; and the like.

The activated electroless plating reagent may also preferably be used to treat wafers in single wafer or batch immersion processing applications where the wafers are either moving or fixed (where the wafers are substantially stationary).

The activator may be used in a single-pass, fresh-dispense mode without recycling of reagent. Alternatively, recirculated chemistries can also be used. This can involve recirculating the reagent through an activator, flowing the reagent through an activator on its way to the product, or placing an activating surface in the recirculation tank.

The electroless plating reagent is exposed to the Activation Material for a time sufficient to enhance the effectiveness of the electroless plating reagent. This exposure may be provided by residence of the solution for a predetermined time period in a bath comprising the Activation Material. More preferably, the electroless plating reagent is exposed to the Activation Material in a continuous process, wherein the electroless plating reagent flows in a manner that provides contact with an Activation Material. Preferably, the electroless plating reagent is in direct contact with or is in proximal fluid contact with the Activation Material for a period of less than about 5 minutes, more preferably from about 0.1 seconds to about one minute, and most preferably from about 0.5 seconds to about 2 seconds. By "proximal fluid contact" is meant that the electroless plating reagent is sufficiently physically close to the Activation Material to enhance the effectiveness of the electroless plating reagent.

While not being bound by theory, it is believed that the Activation Material chemically interacts with the electroless plating reagent to pre-activate the reagent, thereby initiating the deposition process. Additionally or alternatively, it is believed that interaction of dissolved gasses with other gasses or the liquid and/or the addition or removal of dissolved gasses from the electroless plating reagent may occur in the process of the present invention.

The present invention was arrived at through studies of various techniques of carrying out electroless plating operations that were undertaken to provide improvements in the plating process. The following discussion describes observations related to a Co(alloy) coating that is plated using two reducing agents, hypophosphite and a dimethylamine borane complex. It will be appreciated that the observations herein recorded will be more broadly applied to other electroless plating reagents.

Figure 1:
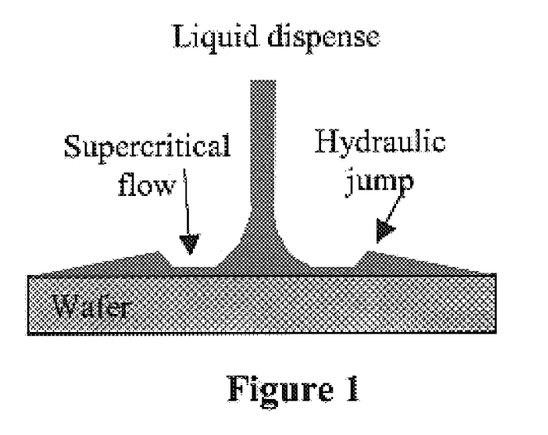
FIG. 1 shows a side view of liquid dispense on a spinning wafer at low rpm that can be used to carry out the process of the present invention.

It was observed that under conventional processes, the electroless plating reagent seemed to plate more slowly, to plate nonuniformly, and/or even sometimes etch the substrate, in regions of exposure to rapidly moving, fresh chemistry (chemical newly introduced to the substrate from a chemical supply system). FIG. 1 shows schematically the dispense of a Co electroless plating reagent onto the center of a wafer rotating at 5 rpm and whose surface is covered with a pre-existing Co film. The approximately 50° C. solution hits in the center and then sheets part way out the wafer in a thin, rapidly moving supercritical flow. At some distance from the center, the liquid slows sufficiently to form a hydraulic jump. Liquid beyond the radius of the hydraulic jump forms a relatively thick, tranquil, puddle moving outward slowly on the slowly rotating wafer.

Figure 2:
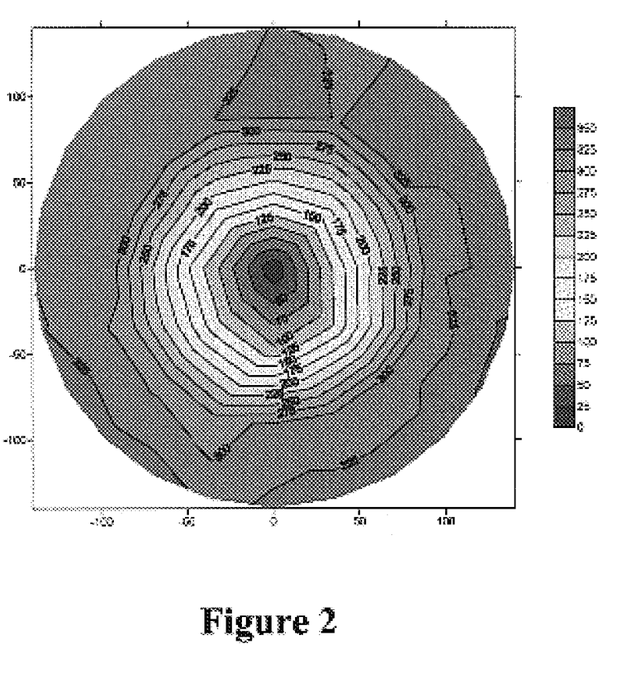
FIG. 2 shows a deposition pattern of metal on a wafer in a comparative example.

The deposition pattern of the coating is represented in FIG. 2, which shows the deposition pattern of cobalt added to a pre-existing cobalt film after a 120 sec center dispense of plating reagent at 5 rpm (herein designated Comparative Example A). The plated material was significantly non-uniform in thickness. The deposited thickness ranged from 0.6 nm near the center to 35.5 nm near the edge. The plated thickness correlates inversely with the expected liquid velocity.

Figure 3:
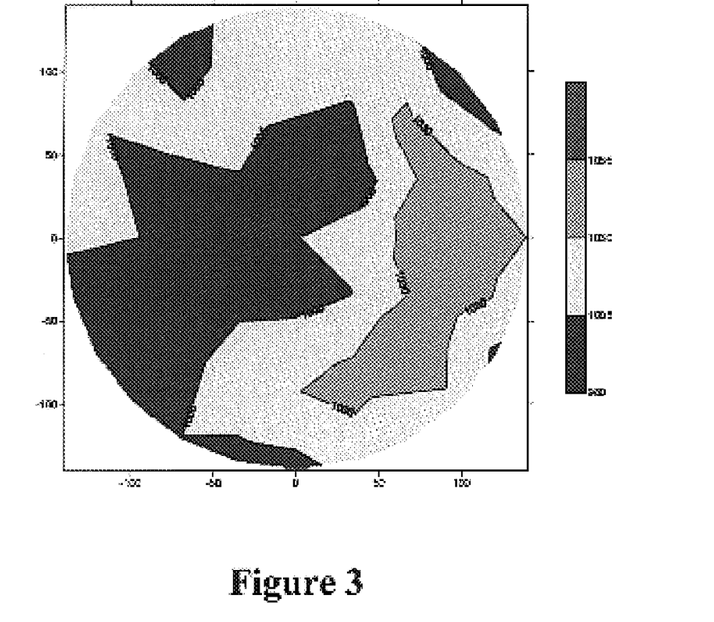
FIG. 3 shows a deposition pattern of metal on a wafer in a comparative example.
Figure 4:
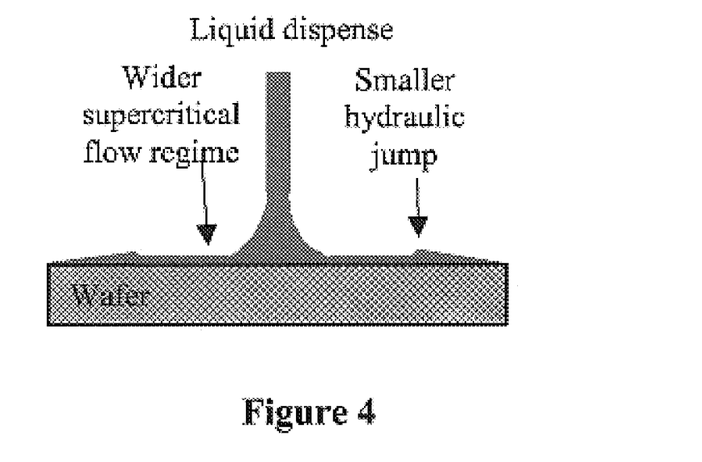
FIG. 4 shows a side view of liquid dispense on a spinning wafer at high rpm that can be used to carry out the process of the present invention.
Figure 5:
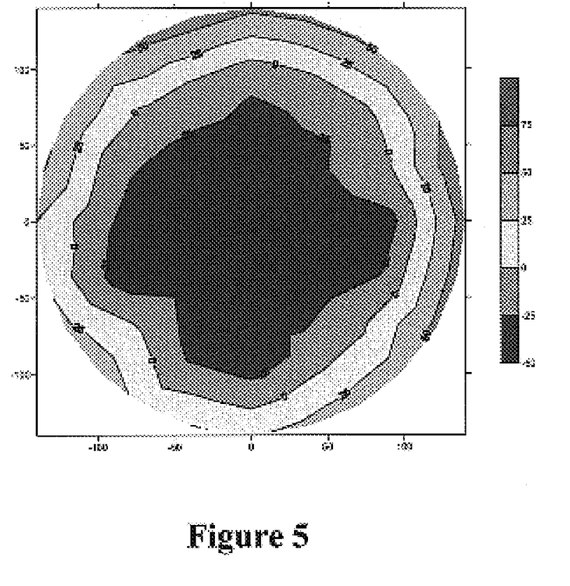
FIG. 5 shows a deposition pattern of metal on a wafer in a comparative example.

A similar test was performed on wafers with a bare copper surface. Bare copper wafers, with no pre-existing cobalt film, showed no deposition of cobalt under these otherwise same conditions. FIG. 3 is a representation of the thickness remaining of the copper that was initially in placed on the wafer, after the attempted cobalt plating, herein designated Comparative Example B. Indeed, the "plating" reagent, rather than providing a coating of cobalt, etched the copper film, reducing its thickness slightly. FIG. 4 shows schematically the flow of liquid when dispensed in the center of a rapidly spinning wafer (300 rpm). The increased centrifugal force increases the radius of the hydraulic jump and increases the flow velocities near the perimeter of the wafer. FIG. 5 is a representation of the deposition pattern of the coating on a wafer, herein designated Comparative Example C. In this example, the cobalt was plated on a wafer that was rotated at 300 rpm and whose surface was covered with a pre-existing cobalt film. Over much of the wafer, the thickness of the pre-existing film was reduced—the cobalt film was etched by the plating reagent.

Figure 6:
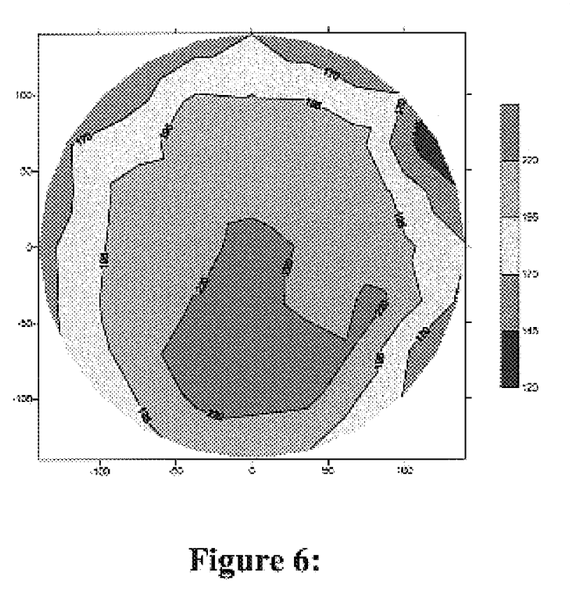
FIG. 6 shows a deposition pattern of metal on a wafer in a comparative example.
Figure 7:
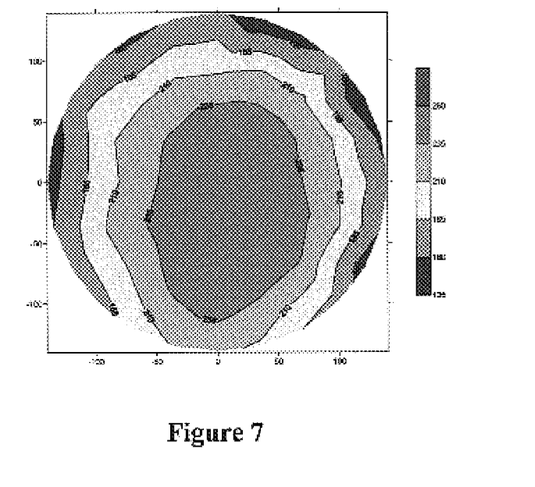
FIG. 7 shows a deposition pattern of metal on a wafer in a comparative example.

FIG. 6 and FIG. 7 are representations of the deposition pattern of the coating on wafers by forming a "puddle" of liquid on pre-existing cobalt films and copper films, respectively. These wafers are designated as Comparative Examples D and E, respectively. In the puddle process, the plating reagent is dispensed for 15 seconds on a very slowly rotating wafer (2 rpm). After the 15 second dispense, the flow is stopped and the puddle is allowed to sit quietly. The solution plates on both cobalt and copper wafers with moderate uniformity from the static solution.

Table 1 shows the numerical data for the five process runs that produced the comparative examples mentioned above. None of the runs plate Co in a way that meets a typical industry uniformity specification of (thickness range)÷(average thickness)≦10% for the plated material. Runs in less symmetric, off-center systems typically show even worse uniformity.

TABLE 1

Summary of plating data for traditional and activated plating processes on 300 mm copper wafers, Single wafer processes.

Figure 12:
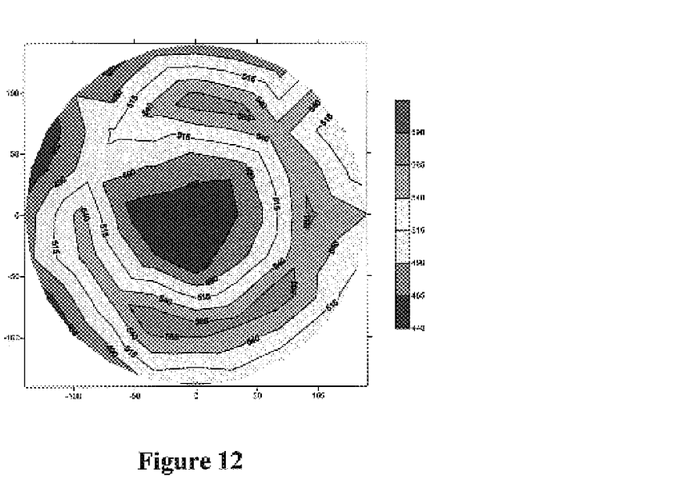
FIG. 12 shows a deposition pattern of metal on a wafer in an example of the present invention.
Figure 13:
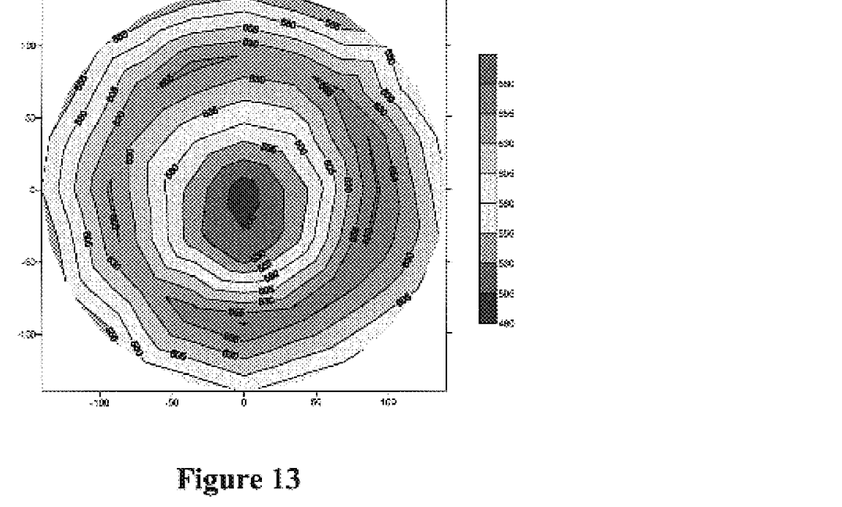
FIG. 13 shows a deposition pattern of metal on a wafer in an example of the present invention.
Figure 14:
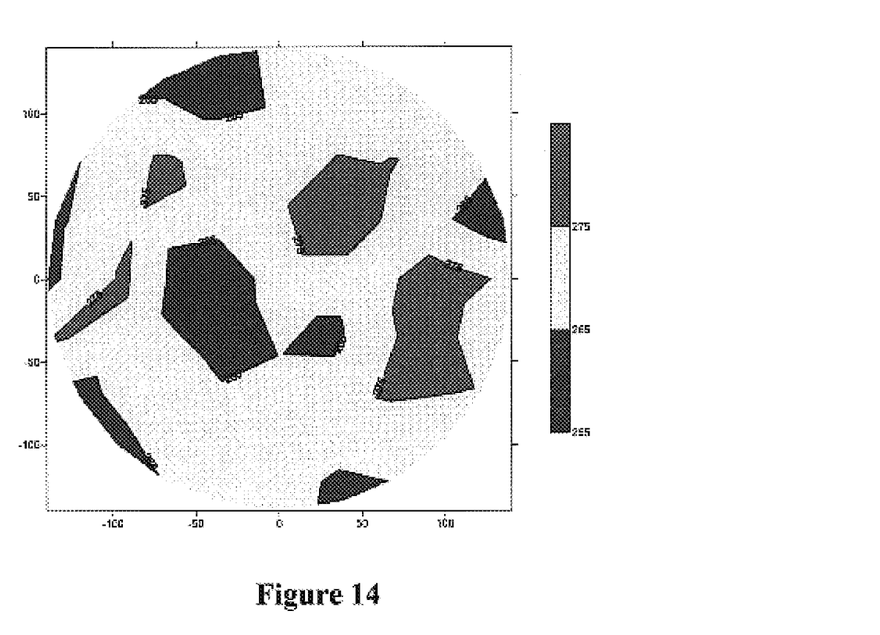
FIG. 14 shows a deposition pattern of metal on a wafer in an example of the present invention.

| Example/Figure | Process | Substrate/ Activator | Average (nm) | Minimum (nm) | Maximum (nm) | Range (nm) | Range Average |
|---|---|---|---|---|---|---|---|
| Comparative Example A/FIG. 2 | 5 rpm | Co/No | 28.8 | 0.6 | 35.5 | 34.8 | 121% |
| Comparative Example B/FIG. 3 | 5 rpm | Cu/No | | | No Plating | | |
| Comparative Example C/FIG. 5 | 300 rpm | Co/No | 0.8 | −4.6 | 7.1 | 11.7 | 1,462% |
| Comparative Example D/FIG. 6 | Puddle | Co/No | 19.0 | 12.0 | 23.8 | 11.8 | 62% |
| Comparative Example E/FIG. 7 | Puddle | Cu/No | 20.0 | 13.7 | 25.6 | 12.0 | 60% |
| Example 1/FIG. 12 | 5 rpm | Co/Yes | 50.6 | 44.1 | 58.8 | 14.7 | 29% |
| Example 2/FIG. 13 | 5 rpm | Cu/Yes | 59.2 | 48.9 | 68.2 | 19.3 | 33% |
| Example 3/FIG. 14 | 180 rpm | Cu/Yes | 26.9 | 25.5 | 28.2 | 2.7 | 10% |

This data shows that the plating reagent is initially relatively inactive with respect to plating, but then in some way "activated" by contacting the metal after some time duration. Fresh, rapidly moving solution etches pre-existing cobalt films, while portions of the same solution that have contacted the metal for on the order of 1 second cause plating. (Given diffusion and bulk flow in the liquid, the "1 second" estimate is a very rough approximation.) Therefore, in order to avoid the plating delay occurring on the surface of the wafer, it is desirable to activate the solution in some way before it reaches the wafer, so that once on the wafer, it plates without undue delay and has a more uniform rate of plating activity over the surface.

EXAMPLES

Construction and Operation

Figure 8:
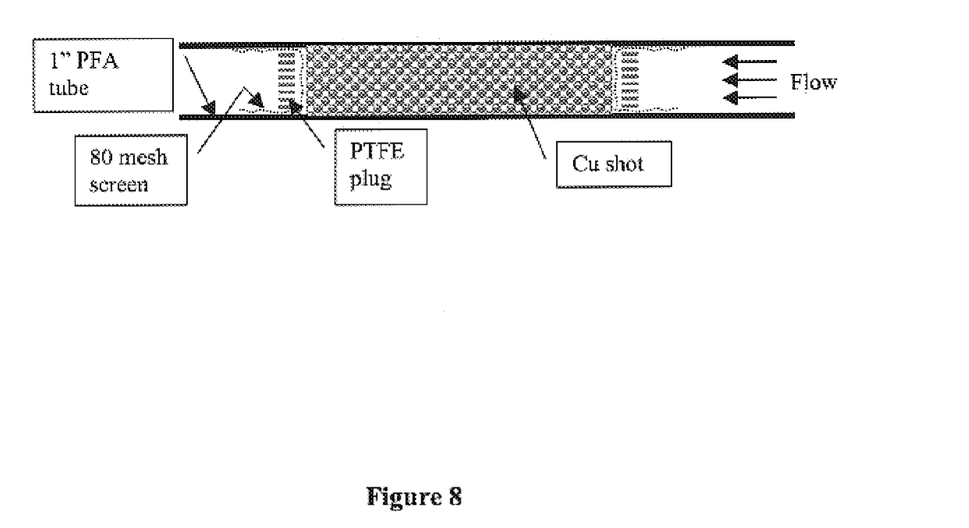
FIG. 8 shows a cross-section view of an activator module that can be used in the process of the present invention.

A 22 cm long segment of a 1" OD PFA tube was packed with 490 g of sub-millimeter copper shot (Aldrich 520381, 20-30 mesh, 99.5%). The grains were moderately spherical, with major and minor axis typically between 0.6 and 0.9 mm. The shot was held in place by an 80 mesh polypropylene screen stretched across perforated PTFE plugs wedged in the tube. A cross-section schematic of the activator is shown in FIG. 8.

Figure 9:
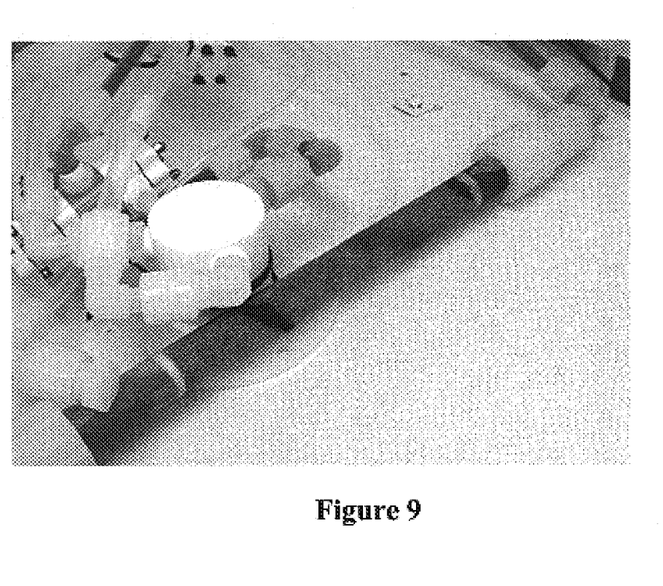
FIG. 9 shows a top view of an activator module that can be used in the process of the present invention.
Figure 10:
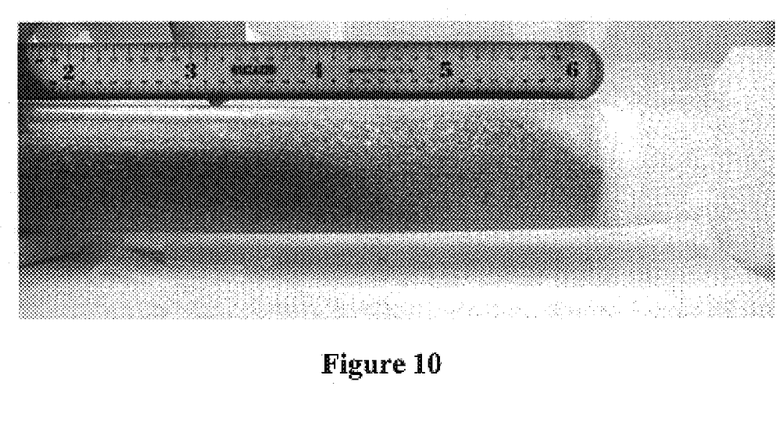
FIG. 10 shows a detailed side view of an activator module that can be used in the process of the present invention.

A photo of the activator as installed is shown in FIG. 9. The purple color is due to the plating reagent filling the tube. The thin white bands near the ends of the tube are the PTFE plugs. FIG. 10 shows the detail of the liquid inlet end of the activator assembly or module. Reagent was passed through the tube at a flow rate of 2.1 liter/minute. The first two inches of the copper shot remain copper colored. Beyond two inches the shot takes on a silvery color indicating cobalt deposition. This photo demonstrates that visible plating of the cobalt does not occur at initial contact of the reagent to copper, but that after initial contact of the reagent to the copper, visibly perceivable plating of the cobalt begins to occur.

Figure 11:
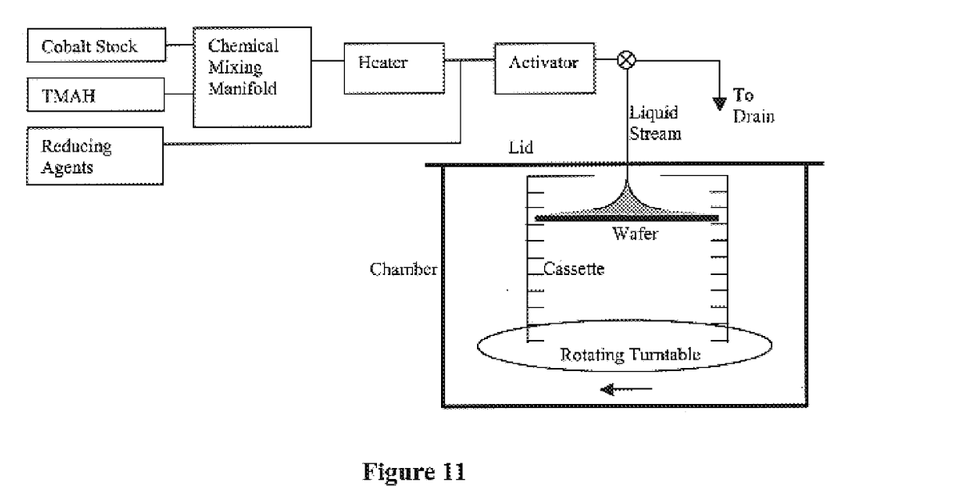
FIG. 11 shows a schematic view of a system that can be used in the process of the present invention.

Plating experiments were performed by dispensing a continuous stream of plating chemistry on to the center of a spinning wafer. FIG. 11 shows the configuration used for these single-wafer (SW) experiments.

The SW experiments of Examples 1-3 were performed in a modified FSI MERCURY® MP Spray Acid Processor. In a standard MERCURY® MP, multiple groups of 25 wafers are held in cassettes. The cassettes are mounted symmetrically around the perimeter of a turntable that is surrounded by a plastic bowl and its lid. Liquids are sprayed on the cassettes of wafers from a center spray post (CSP) protruding down from the center of the lid and a side-bowl spray post (SBSP) mounted on the side of the bowl. Stock solutions of chemicals are stored in pressurized canisters. Chemistries to be sprayed on the wafers are made by blending individual chemicals and DI water in a chemical mixing manifold, and delivering them through the CSP onto the wafers. The chemistries are heated to approximately 50° C. en route to the CSP by an in-line chemical heater. Preferably, the heat sensitive components of the chemistries to be applied to the wafers are not directly heated, but are blended with preheated non-heat sensitive components of the chemistries. The MERCURY® MP Spray Acid Processor was modified to allow the mixed chemistry to flow onto the center of a single spinning wafer (FIG. 11). A hole was cut in the top of a cassette to allow liquid flow from above. The cassette was mounted in the center of the turntable, on the axis of rotation. The CSP was shortened and modified to dispense a solid stream of plating chemistry or rinse water onto the center of the wafer. The cassette, turntable and chamber were rinsed with water flows from the SBSP and through the turntable. The wafer was dried by rotating at 300 rpm in a dry nitrogen atmosphere. The chemical activator was inserted in the chemical delivery line just before the chemical entered the CSP. The basic plating recipe sequence is shown in Table 2.

TABLE 2

Typical plating recipe sequence.

| Step | Time (Sec) | Speed (rpm) | Temp. (° C.) | Flows |
|---|---|---|---|---|
| 1 | 60 | 20 | 55 | DI water to preheat the wafer and plumbing |
| 2 | 90 | 20 | 55 | Continue warm DI to wafer Initiate chemical flow and heating (flow diverted to drain away from the wafer) |
| 3 | 60 | 5 | 45 | Dispense heated chemistry onto wafer |
| 4 | | | | Rinse and dry sequence |

300 mm silicon wafers to be plated were first provided with a top coating of a 25 to 100 nm thick film of cobalt metal or copper metal films, as indicated. After processing with a cobalt electroless plating reagent comprising hypophosphite and a dimethylamine borane complex as reducing agents, the thickness of the cobalt coating was determined by x-ray fluorescence analysis (XRF) at 49 points distributed across the wafer.

Examples 1-3

Examples 1 and 2 comprise coatings of wafers in a 5 rpm process, wherein the wafers comprise pre-existing cobalt films and bare copper films, respectively, wherein the reagent is exposed to an Activation Material as described. The representation of deposition pattern of the coatings is shown in FIG. 12 and FIG. 13, respectively. These figures should be compared to FIGS. 2 and 3, respectively. The percent uniformity of the coating on the pre-existing cobalt film improved from 121% to 29% with the addition of the activator, and shown in Table 1. It will be recalled that without the activator, the bare copper did not plate (Comparative Example B/FIG. 3). With the activator, the wafer was plated with a uniformity of 33%. Example 3 (shown in FIG. 14) shows excellent uniformity results with 10% total nonuniformity (range/average) when plating bare copper at 180 rpm. This performance meets the projected industry requirements of 10% plating uniformity.

Beyond better uniformity, the average deposition rate increased dramatically from 28.8 to 50.6 nm during the two minute plating step on pre-existing cobalt films (Comparative Example A as compared to Example 1). The average deposition rate on copper increased from zero to 59.2 nm (Comparative Example B as compared to Example 2).

An unexpected benefit was the improvement in coating quality. Coatings deposited with pre-exposure to an Activation Material were much "shinier" (and probably smoother) than coatings deposited without pre-exposure to an Activation Material. Any nonuniformities in the coating at optical length scales are highly undesirable.

An additional set of experiments were performed in a standard (i.e. unmodified) FSI ZETA® Spray Acid Processor, wherein 300 mm wafers with a copper coating were held in standard cassettes in a 2P orientation (i.e., two cassettes are oriented on the turntable symmetrically on opposite sides of the axis of rotation of the turntable). The following examples were prepared:

Comparative Example F

A wafer was treated with electroless plating reagent that had not been exposed to an activator using the FSI MERCURY® MP Spray Acid Processor. The wafer was not precleaned, but was prerinsed and preheated for 10 minutes with surfactant and DI water at 50° C. The approximately 50° C. plating reagent was applied to the wafer by atomization at 26.1 dynamic while the turn table was rotated at 300 rpm. Plating was carried out for 360 seconds.

The following plating results were observed:

TABLE 3

| Comparative Example F. | | | | | |
|---|---|---|---|---|---|
| Average (nm) | Minimum (nm) | Maximum (nm) | Range (nm) | Standard Deviation (%) | Range/Average. |
| 22.7 | 10.2 | 25.0 | 14.8 | 11.8 | 65% |

Figure 15:
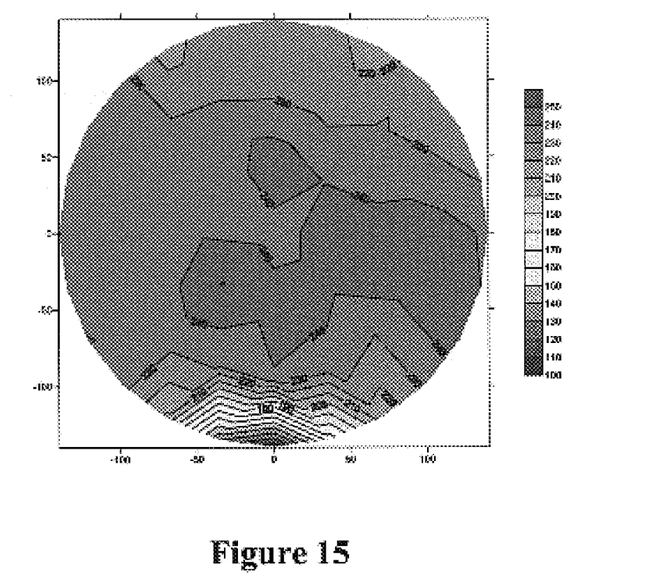
FIG. 15 shows a deposition pattern of metal on a wafer in a comparative example.

The deposition pattern of the coating is represented in FIG. 15. It is noted that the plating thickness is particularly low in the front of the wafer (i.e., the bottom of the wafer as shown in the figure), generally corresponding to the first contact point of the electroless plating reagent as it is applied from the CSP.

Example 4

A wafer was treated with electroless plating reagent that had been exposed to an activator using the FSI ZETA® Spray Acid Processor. The activator was provided in the form of a 22 cm long segment of a 1" OD PFA tube was packed with 490 g of sub-millimeter copper shot (Aldrich 520381, 20-30 mesh, 99.5%). The grains were moderately spherical, with major and minor axis typically between 0.6 and 0.9 mm. The shot was held in place by an 80 mesh polypropylene screen stretched across perforated PTFE plugs wedged in the tube. Hereafter, these 22 cm segments are referred to as Activator Modules. The wafer was not precleaned, but was prerinsed and preheated for 10 minutes with surfactant and DI water at 50° C. The approximately 50° C. plating reagent was applied to the wafer by atomization at 26.1 dynamic while the turn table was rotated at 300 rpm. Plating was carried out for 360 seconds.

The following plating results were observed.

TABLE 4

| Example 4. | | | | | |
|---|---|---|---|---|---|
| Average (nm) | Minimum (nm) | Maximum (nm) | Range (nm) | Standard Deviation (%) | Range/Average. |
| 27.8 | 24.7 | 30.1 | 5.4 | 4.9 | 19% |

Figure 16:
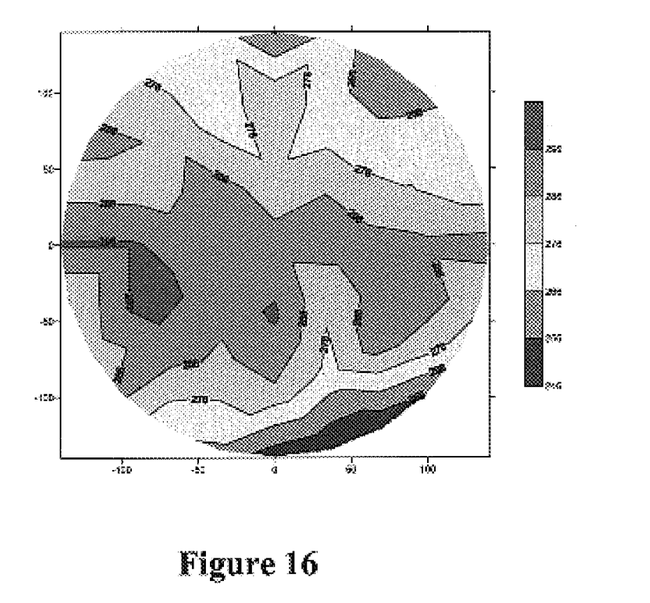
FIG. 16 shows a deposition pattern of metal on a wafer in an example of the present invention.

The deposition pattern of the coating is represented in FIG. 16. The percent range is improved dramatically from 65% to 19% by the addition of one Activator Module.

Example 5

A wafer was treated with electroless plating reagent that had been exposed to an activator using the FSI ZETA® Spray Acid Processor. The activator was provided in the form of four Activator Modules in a configuration where the reagent supply line is divided to flow the reagent through two parallel channels of two serially connected Activator Modules.

The wafer was not precleaned, but was prerinsed and preheated for 10 minutes with surfactant and DI water at 50° C. The approximately 50° C. plating reagent was applied to the wafer by atomization at 26.1 dynamic while the turn table was rotated at 25 rpm. Plating was carried out for 360 seconds.

The following plating results were observed.

TABLE 5

| Example 5. | | | | | |
|---|---|---|---|---|---|
| Average (nm) | Minimum (nm) | Maximum (nm) | Range (nm) | Standard Deviation (%) | Range/Average. |
| 23.7 | 20.0 | 25.9 | 5.9 | 5.3 | 25% |

Figure 17:
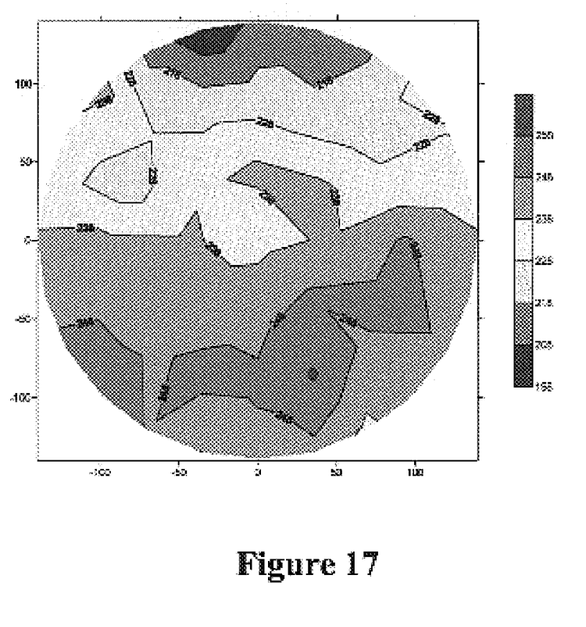
FIG. 17 shows a deposition pattern of metal on a wafer in an example of the present invention.

The deposition pattern of the coating is represented in FIG. 17. The use of four Activator Modules completely eliminated the low area at the front of the wafer.

Example 6

A 200 mm wafer was treated with electroless plating reagent that had been exposed to an activator using the FSI MERCURY® MP Spray Acid Processor. The activator was provided in the form of a single Activator Module.

The wafer was not precleaned, but was prerinsed and preheated for 10 minutes with surfactant and DI water at 50° C. The approximately 50° C. plating reagent was applied to the wafer while the turn table was rotated at 5 rpm. Plating was carried out for 360 seconds.

The following plating results were observed.

TABLE 6

| Example 6. | | | | | |
|---|---|---|---|---|---|
| Average (nm) | Minimum (nm) | Maximum (nm) | Range (nm) | Standard Deviation (%) | Range/Average. |
| 9.5 | 8.2 | 10.9 | 2.7 | 5.8 | 28% |

Figure 18:
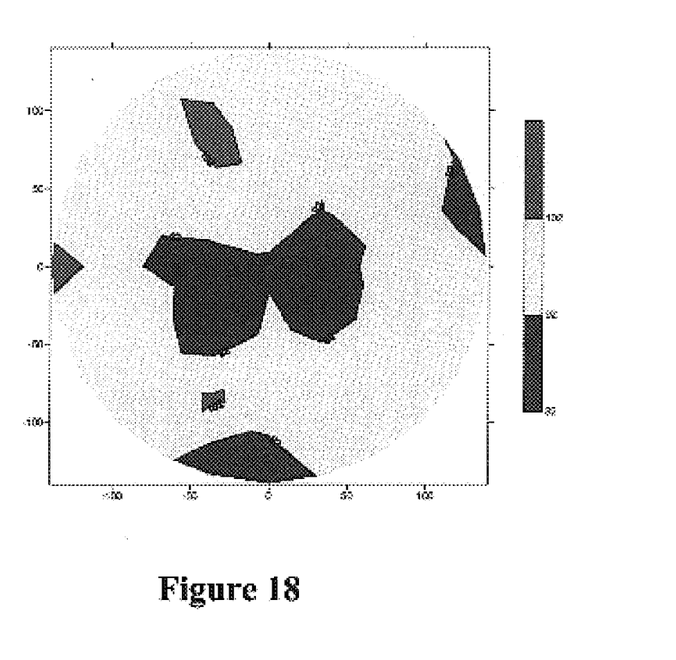
FIG. 18 shows a deposition pattern of metal on a wafer in an example of the present invention.

The deposition pattern of the coating is represented in FIG. 18. This Example 6 data should be compared with Comparative Example G and H.

Comparative Example G

A 200 mm wafer was treated with electroless plating reagent that was not exposed to an activator using the FSI MERCURY® MP Spray Acid Processor.

The wafer was not precleaned, but was prerinsed and preheated for 10 minutes with surfactant and DI water at 50° C. The approximately 50° C. plating reagent was applied to the wafer while the turn table was rotated at 5 rpm. Plating was carried out for 360 seconds.

The following plating results were observed.

TABLE 7

Comparative Example G.

| Average (nm) | Minimum (nm) | Maximum (nm) | Range (nm) | Standard Deviation (%) | $\frac{\text{Range}}{\text{Average}}$ |
|---|---|---|---|---|---|
| −2.0 | −2.8 | −1.4 | −1.4 | −17.4 | 70% |

Figure 19:
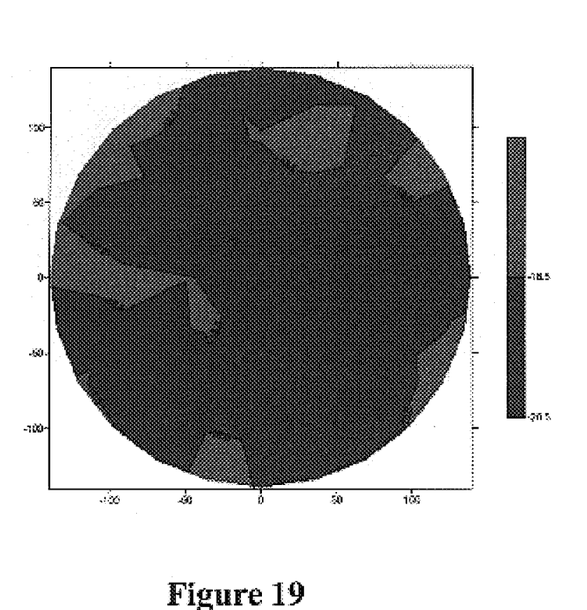
FIG. 19 shows a deposition pattern of metal on a wafer in a comparative example.

The deposition pattern of the coating is represented in FIG. 19. No plating was observed without the Activator Module.

Comparative Example H

A 200 mm wafer was treated with electroless plating reagent that had been exposed to an activator using the FSI MERCURY® MP Spray Acid Processor. The activator was provided in the form of a single Activator Module, except that instead of copper shot, the tube was filled with glass beads having a 1 mm diameter nominal particle size (Sigma Aldrich part no Z273619).

The wafer was not precleaned, but was prerinsed and preheated for 10 minutes with surfactant and DI water at 50° C. The approximately 50° C. plating reagent was applied to the wafer while the wafer was rotated at 5 rpm. Plating was carried out for 360 seconds.

The following plating results were observed.

TABLE 8

Comparative Example H.

| Average (nm) | Minimum (nm) | Maximum (nm) | Range (nm) | Standard Deviation (%) | $\frac{\text{Range}}{\text{Average}}$ |
|---|---|---|---|---|---|
| −1.9 | −2.8 | −1.1 | 1.7 | 17.7 | 89% |

Figure 20:
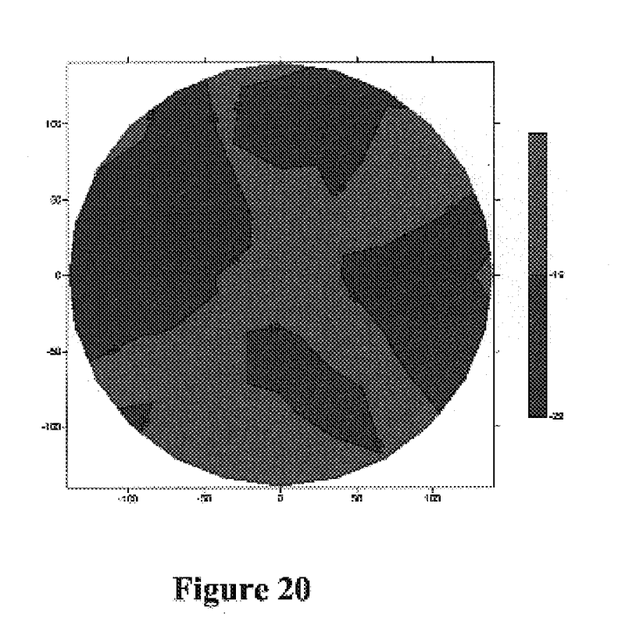
FIG. 20 shows a deposition pattern of metal on a wafer in a comparative example.

The deposition pattern of the coating is represented in FIG. 20. The use of a Comparative Module packed with glass beads did not result in plating.

All percentages and ratios used herein are weight percentages and ratios unless otherwise indicated. All publications, patents and patent documents cited are fully incorporated by reference herein, as though individually incorporated by reference. Numerous characteristics and advantages of the invention meant to be described by this document have been set forth in the foregoing description. It is to be understood, however, that while particular forms or embodiments of the invention have been illustrated, various modifications, including modifications to shape, and arrangement of parts, and the like, can be made without departing from the spirit and scope of the invention.

The invention claimed is:

1. A method for electroless plating of a substrate, comprising
   a) providing a process chamber for metal plating of a substrate;
   b) exposing an electroless plating reagent comprising a metal to be plated and at least one reducing agent to a solid phase Activation Material to form an activated electroless plating reagent prior to application of the electroless plating reagent to the substrate; and
   c) applying the activated electroless plating reagent to a substrate in the process chamber under conditions to cause the metal of the electroless plating reagent to deposit on the substrate.

2. The method of claim 1, wherein the step of exposing the electroless plating reagent to an Activation Material takes place outside of the process chamber.

3. The method of claim 1, wherein the step of exposing the electroless plating reagent to an Activation Material is a continuous process.

4. The method of claim 1, wherein the Activation Material has a surface area of from about 1 cm$^2$/g to about 20 cm$^2$/g.

5. The method of claim 1, wherein the Activation Material is in the form of particles comprising the Activation Material at least on a portion of the surface of the particles.

6. The method of claim 1, wherein step b) comprises causing the electroless plating reagent to flow through a bed of particles comprising a metal at least on a portion of the surface of the particles.

7. The method of claim 1, wherein the Activation Material comprises a metal selected from copper, silver, gold, nickel, palladium, platinum, cobalt, rhodium, iridium, and combinations thereof.

8. The method of claim 1, wherein the Activation Material comprises copper.

9. The method of claim 1, wherein the Activation Material comprises nickel.

10. The method of claim 1, wherein the Activation Material comprises cobalt.

11. The method of claim 1, wherein the metal to be plated comprises a metal selected from copper, silver, gold, nickel, palladium, platinum, cobalt, rhodium, iridium, and combinations thereof.

12. The method of claim 11, wherein the metal to be plated further comprises a secondary metal selected from the group of chromium, molybdenum, tungsten, manganese, technetium, rhenium, and combinations thereof.

13. The method of claim 1, wherein the metal to be plated comprises cobalt.

14. The method of claim 1, wherein the metal to be plated and the Activation Material comprise the same metal.

15. The method of claim 1, wherein the substrate is a copper containing surface.

16. The method of claim 1, wherein the substrate is a semiconductor wafer.

* * * * *